United States Patent
Giebeler et al.

(10) Patent No.: US 8,969,811 B2
(45) Date of Patent: Mar. 3, 2015

(54) DEVICE TO DETECT THERMAL RADIATION WITH HIGH RESOLUTION METHOD TO MANUFACTURE AND USE THE DEVICE

(75) Inventors: Carsten Giebeler, Edinburgh (GB); Matthias Schreiter, Munich (DE); Uwe Rettig, Ottobrunn (DE)

(73) Assignee: Pyreos Ltd., Edinburgh (GB)

( * ) Notice: Subject to any disclaimer, the term of this patent is extended or adjusted under 35 U.S.C. 154(b) by 286 days.

(21) Appl. No.: 12/680,286

(22) PCT Filed: Sep. 29, 2008

(86) PCT No.: PCT/EP2008/008280
§ 371 (c)(1),
(2), (4) Date: Nov. 18, 2010

(87) PCT Pub. No.: WO2009/043571
PCT Pub. Date: Apr. 9, 2009

(65) Prior Publication Data
US 2011/0049369 A1 Mar. 3, 2011

(30) Foreign Application Priority Data

Sep. 28, 2007 (DE) .......................... 10 2007 046 451

(51) Int. Cl.
*G01J 5/02* (2006.01)
*H01L 31/101* (2006.01)
(Continued)

(52) U.S. Cl.
CPC .................. *H01L 31/101* (2013.01); *G01J 5/02* (2013.01); *G01J 5/024* (2013.01); *G01J 5/0245* (2013.01);
(Continued)

(58) Field of Classification Search
CPC ............. G01J 5/02; H01L 27/14; H01L 27/16
USPC .......................................................... 250/352
See application file for complete search history.

(56) References Cited

U.S. PATENT DOCUMENTS 3,989,946 A * 11/1976 Chapman et al. ............. 250/332
4,740,700 A * 4/1988 Shaham et al. ............... 250/332
(Continued)

FOREIGN PATENT DOCUMENTS

DE 195 25 071      1/1997
DE 100 04 216 A1   8/2001
(Continued)

*Primary Examiner* — Marcus Taningco
(74) *Attorney, Agent, or Firm* — Edell, Shapiro & Finnan, LLC

(57) ABSTRACT

A device to detect thermal radiation has a membrane and at least two detector elements that are respectively set up to transduce thermal radiation into an electrical signal and are mounted situated next to one another on the membrane, wherein at least one heat dissipation path is provided on the side of the membrane facing towards the detector elements and/or on the side of the membrane facing away from the detector elements, which heat dissipation path has a higher heat conductivity than the membrane and is connected with the detector elements in a heat-conductive manner via the membrane so that heat can be discharged from the detector elements with the heat dissipation path, whereby the response time of the detector elements is short; and wherein at least one heat barrier that has a lower heat conductivity than the membrane and extends between the detector elements is provided integrated into the membrane, such that a heat conduction in the membrane from the one detector element to the other detector element is prevented by the heat barrier; whereby the crosstalk of the detector elements is low.

18 Claims, 1 Drawing Sheet

(51) Int. Cl.
*G01J 5/04* (2006.01)
*G01J 5/06* (2006.01)
*G01J 5/34* (2006.01)
*H01L 37/02* (2006.01)

(52) U.S. Cl.
CPC .. *G01J 5/04* (2013.01); *G01J 5/046* (2013.01); *G01J 5/06* (2013.01); *G01J 5/34* (2013.01); *H01L 37/02* (2013.01)
USPC .......................................................... 250/352

(56) References Cited

U.S. PATENT DOCUMENTS

| | | | | |
|---|---|---|---|---|
| 4,894,544 A | * | 1/1990 | Turnbull | 250/338.3 |
| 5,193,911 A | * | 3/1993 | Nix et al. | 374/121 |
| 5,420,420 A | * | 5/1995 | Taylor et al. | 250/338.3 |
| 5,523,564 A | * | 6/1996 | Yamada et al. | 250/338.1 |
| 5,583,058 A | * | 12/1996 | Utsumi et al. | 250/338.4 |
| 6,342,667 B1 | * | 1/2002 | Shen et al. | 136/201 |
| 6,372,656 B1 | | 4/2002 | Laermer et al. | |
| 6,655,834 B1 | | 12/2003 | Frey et al. | |
| 7,208,736 B2 | | 4/2007 | Watanabe | |
| 2004/0113076 A1 | | 6/2004 | Guo et al. | |

FOREIGN PATENT DOCUMENTS

| | | |
|---|---|---|
| EP | 1 041 371 | 10/2000 |
| EP | 1 580 542 | 9/2005 |
| WO | WO 2004/020960 | 3/2004 |

\* cited by examiner

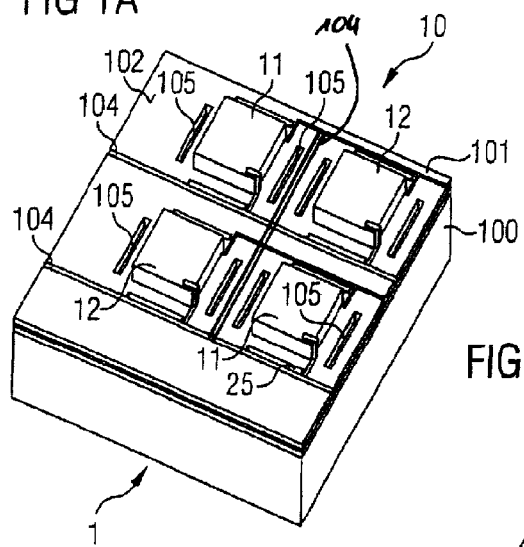
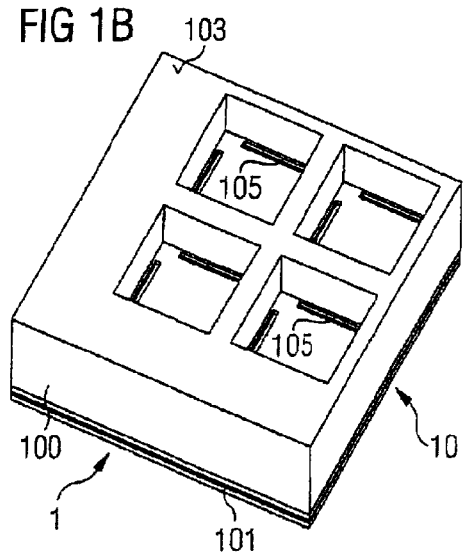
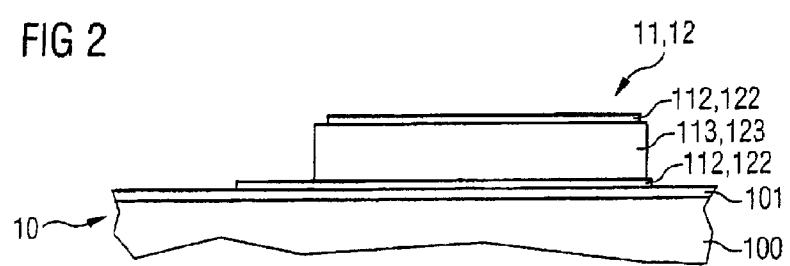

DEVICE TO DETECT THERMAL RADIATION WITH HIGH RESOLUTION METHOD TO MANUFACTURE AND USE THE DEVICE

BACKGROUND OF THE INVENTION

1. Field of the Invention

The invention concerns a device to detect thermal radiation. In addition to the device, a method is specified for the production and a use of the device.

2. Description of the Prior Art

A device to detect thermal radiation is known from DE 100 04 216 A1, for example. This device is designated as a pyrodetector. The detector element is a pyroelectric detector element. It possesses a layer design with two electrode layers and a pyroelectric layer with pyroelectrically sensitive material arranged between the electrode layers. This material is lead zirconate titanate (PZT). For example, the electrodes consist of platinum or of a chromium-nickel alloy absorbing the thermal radiation.

The thermal detector element is connected with a detector element substrate made of silicon (silicon substrate). An insulation layer for electrical and thermal insulation of the detector element and the detector element substrate from one another is arranged between said detector element and the detector element substrate. The insulation layer thereby possesses: an evacuated void that extends across a base surface of the detector element; a support layer of the void; and a cover of the support layer and the void. The support layer consists of polysilicon. The cover is made of a boron-phosphorus-silicate glass (BPSG). A readout circuit is integrated into the detector element substrate to read out, process and/or relay the electrical signal generated by the detector element. The readout circuit is realized via the CMOS (Complementary Metal Oxide Semiconductor) technique.

A device comparable to this for the detection of thermal radiation is known from DE 195 25 071 A1. The thermal detector element is likewise a pyroelectric detector element described above. The detector is arranged on a multi-layer detector element substrate. One of the layers of the detector element substrate is an electrically insulating membrane. The membrane consists of a $Si_3N_4/SiO_2/Si_3N_4$ triple layer, for example. The membrane is in turn applied on a silicon substrate of the detector element substrate.

In the known devices a number of detector elements are present (detector element array). In order to obtain an optimally high spatial resolution, the detector elements are arranged optimally close to one another. However, the more closely that the detector elements are arranged, the higher the probability of a "crosstalk". The desired high resolution is lost.

SUMMARY OF THE INVENTION

It is the object of the invention to specify a compact device to detect thermal radiation, wherein the device has both high spatial resolution and a low response time.

To achieve the object, a device to detect thermal radiation is specified, with a membrane and at least two detector elements that are respectively set up to transduce thermal radiation into an electrical signal and are mounted situated next to one another on the membrane, wherein at least one heat dissipation path is provided on the side of the membrane facing towards the detector elements and/or on the side of the membrane facing away from the detector elements, which heat dissipation path has a higher heat conductivity than the membrane and is connected with the detector elements in a heat-conductive manner via the membrane so that heat can be discharged from the detector elements with the heat dissipation path, whereby the response time of the detector elements is short; and wherein at least one heat barrier that has a lower heat conductivity than the membrane and extends between the detector elements is provided integrated into the membrane, such that a heat conduction in the membrane from the one detector element to the other detector element is prevented by the heat barrier; whereby the crosstalk of the detector elements is low.

To achieve the object, a method is also specified for the production of the device with the following method steps: a) provide a membrane with at least one heat sink in the form of the heat dissipation path to generate a directed heat flow and at least one thermal regulation device in the form of the heat barrier to regulate the heat flow and b) arrange the thermal detector elements on the membrane such that heat flow away from at least one of the thermal detector elements in the direction of the heat sink (set up my means of said heat sink) can be generated and a magnitude of the heat flow can be regulated by the regulation device.

The device according to the invention can also be used as a movement sensor, as a presence sensor and/or as a heat image camera according to the invention.

The thermal radiation to be detected has a wavelength of over 1 μm. The wavelength is advantageously selected from the range from 5 to 15 μm. The thermal detector element is based on the Seebeck effect, for example. The thermal detector element is advantageously a pyroelectric detector element. As described above, the pyroelectric detector element consists of a pyroelectric layer with a pyroelectrically sensitive material and electrode layers mounted on both sides. The pyroelectrically sensitive material is, for example, a ceramic such as lithium niobate ($LiNbO_3$) or lead zirconate titanate. A ferroelectric polymer such as polyvinylidene fluoride (PVDF) is also conceivable. Platinum or a platinum alloy is considered as an electrode material of the electrode layers, for example. A chromium-nickel electrode or an electrode made from an electrically conductive oxide is also conceivable. For example, a detector element possesses a rectangular footprint with an edge length of 10 μm to 200 μm. Smaller edge lengths (for example 5 μm) or even greater edge lengths of up to 400 μm are likewise conceivable. An element center-to-center spacing (pitch) amounts to 20 μm to 400 μm. Larger spacings are also conceivable.

The heat sink in the form of the heat dissipation path leads to the generation of the heat flow, and therefore to a transportation of heat away from the detector elements. The heat sink and the detector elements are connected with one another in a thermally conductive manner. Without additional measures, however, a sensitivity of the detector elements would be markedly reduced via an increased heat flow that is entailed by this. As a countermeasure the regulation device is present in the form of the heat barrier. The dimension (magnitude) of the heat flow is adjusted with the aid of the regulation device. The regulation device acts as a thermal resistor. It is thereby achieved that the sensitivity of the detector elements is maintained.

The detector element and the additional detector element are arranged next to one another on a surface segment of a common detector element substrate that is formed by the membrane. The detector elements can be arranged very close to one another in that the thermal crosstalk or, respectively, the thermal coupling between the detector elements is efficiently suppressed.

The heat sink is arranged between the thermal detector element and the additional thermal detector element. In this configuration the heat emitted by the detector element and the additional adjacent detector element is dissipated. There is no thermal crosstalk between the detector elements.

The heat sink is advantageously arranged on the surface segment on which the detector elements are arranged. As an alternative to this, the heat sink is arranged on a side of the detector element substrate facing away from the surface segment, i.e. on the back side of the detector element substrate. It is also conceivable that the heat sink is arranged on both sides, thus on the detector element side and on the reverse side of the detector element substrate.

The heat dissipation path is preferably made of silicon. The common detector element substrate possesses the membrane that forms the surface segment on which the detector elements are arranged. The membrane consists of a membrane layer or of multiple membrane layers. A plurality of inorganic or organic materials can thereby be used. For example, the membrane layer is made of silicon dioxide ($SiO_2$) or silicon nitride ($Si_3N_4$). The particular advantage of layers made of these materials is the electrical and thermal insulation effect of the materials. These materials act as electrical and thermal insulators.

The heat dissipation path is preferably fashioned as a web that is arranged on the membrane. It is also preferable that the heat dissipation path is formed by a plurality of the webs that surround a region of the membrane in which at least one of the detector elements is arranged. The heat sink and/or the regulation device are respectively a component of the common detector element substrate. This in particular is achieved in that the heat sink possesses at least one web with thermally conductive material that is arranged on the common detector element substrate. The web or the webs can be arranged on the front side and on the back side. The heat is efficiently discharged in the direction of the heat sink via the webs. The webs additionally fulfill a support function: this is in particular advantageous with regard to the manufacturing of the device with wafer bond processes.

Alternatively, the heat dissipation path is preferably formed by a thin film that is arranged on the membrane. The heat sink is thus preferably the thin film with thermally conductive material that is applied on the detector element substrate. The detector element substrate is, for example, a multilayer membrane (mentioned above). In this multilayer membrane a layer can be integrated as a material that has good thermal conductivity. The heat is dissipated in a directed manner via this layer, which is in turn connected in a thermally conductive manner with a heat sink. Arbitrary materials are conceivable as a thermally conductive material of the web or a thin film. The thermally conductive material is advantageously silicon, as it is preferably used in CMOS technology.

The heat barrier is preferably an evacuated recess provided in the membrane. The regulation device thus preferably possesses a clearance of the detector element substrate. For example, a thinning of the detector element substrate or a hole in the detector element substrate is conceivable. A thermal cross section of the detector element substrate is reduced by the recess in comparison to a detector element substrate without recess. This leads to a reduction of a lateral heat transfer. This leads to the situation that the heat flow from a detector element to the heat sink is hindered. As a consequence of this the sensitivity of the detector element or, respectively, of the detector elements is maintained to the greatest possible extent.

The evacuated recess is preferably a slit provided in the membrane that runs between two adjacent detector elements, perpendicular to an imaginary connection line defined by the two detector elements. It is preferred that at least two slits parallel to one another and running at the same level are provided so that the slits are arranged between the detector elements. Moreover, it is preferred that the heat dissipation path runs between the slits so that the heat dissipation path is thermally insulated from the detector elements by the slits.

The detector elements are attached to the membrane and are in heat-conductive contact with it. Therefore the detector elements are coupled in a heat-conductive manner with one another via the membrane. The heat conduction through the membrane from the one detector element to the other detector element is defined by the heat conductivity coefficients of the membrane and the membrane thickness. In that the heat barrier is arranged between the detector elements, the detector elements are thermally insulated from one another by the membrane with regard to their heat exchange. A crosstalk of the detector elements due to the heat exchange is thereby reduced. The spatial resolution of the device is thus high although the population density of the membrane with the detector elements is high. The detector element is also rapidly heated by the thermal radiation since, due to the insulation effect of the heat barrier, only small amounts of heat are dissipated from the detector element through the membrane. The rise of the electrical signal at the point in time of the incidence of the thermal radiation on the detector element is therefore steep. However, it is hereby disadvantageous that, due to the insulation effect of the heat barrier, the detector element only cools slowly via heat dissipation across the membrane at the end of the heat radiation. This would have the consequence that the response time of the detector element would be long. The provision of the heat dissipation path with which heat is quickly discharged from the detector element provides relief so that—due to the heat dissipation effect of the heat dissipation path—the detector element cools rapidly via heat dissipation over the heat dissipation path at the end of the heat radiation. The drop-off of the electrical signal at the point in time of the absence of the thermal radiation at the detector element is thereby steep. The response time of the device is thus short, although the device has a high population density with the detectors.

According to the further aspect of the invention, the device is used as a movement sensor, as a presence sensor and/or as a heat image camera. For the heat image camera the device is equipped with a plurality of detector elements, for example 240×320 detector elements (QVGA standard) or more. This is possible due to the high integration density (number of detector elements per areal unit).

In summary, the following advantages of the invention are to be emphasized:
The device for detection of thermal radiation is compact.
An integration density is increased via the invention in comparison to the prior art.
A crosstalk probability between adjacent detector elements is reduced. At the same time, however, the sensitivity of the individual detector elements is maintained
The device is in particular mechanically stabilized given the use of webs.

The device for detection of thermal radiation is presented in the following using an exemplary embodiment and associated Figures. Figures are schematic and do not show any illustrations to scale.

BRIEF DESCRIPTION OF THE DRAWINGS

FIG. 1A shows a device for detection of thermal radiation in accordance with the present invention, in a perspective view from above.

FIG. 1B shows the device for detection of thermal radiation of FIG. 1A in a perspective view from below.

FIG. 2 is a lateral cross-section through a detector element on a detector element substrate in accordance with the present invention.

DESCRIPTION OF THE PREFERRED EMBODIMENTS

The device 1 for detection of thermal radiation possesses a detector element substrate 10 with a membrane 101 on which are mounted a thermal detector element 11 and at least one additional thermal detector element 12. The detector element substrate possesses a silicon substrate 100. The thermal detector elements are arranged in a detector element array 110 on the surface segment 102 of the membrane. A detector element array with 2×2 detector elements is shown as an example in FIG. 1A.

The detector elements 11 and 12 are pyroelectric detector elements in thin film design with two electrode layers 112 and 122 and a pyroelectric layer 113 and 123 respectively arranged between the electrode layers (FIG. 2). The pyroelectric layer is respectively a layer made of PZT as a pyroelectrically sensitive material, approximately 1 µm thick. The electrode layers are made of platinum and a chromium-nickel alloy with layer thicknesses of approximately 20 nm.

The membrane 101 is a $Si_3N_4/SiO_2/Si_3N_4$ triple layer. For the detector elements, a readout circuit (not shown) is integrated into the silicon substrate of the detector element substrate.

Thin webs 104 made of silicon are arranged between the detector elements, both on the front side 102 and on the back side 103. The thin webs act as respective heat sinks from at least one of the detector elements away to a heat sink. The heat sink is not shown.

Moreover, clearances in the form of slits 105 are contained in the membrane. The slits act as regulation devices to regulate the respective heat flow.

Finite element (FEM) simulations of the thermal overcoupling in the example of detector elements with a base area of 200×200 µm² given a pitch of the detector elements of 400 µm have confirmed the effectiveness of the inventive combination of slit and web:

| Base structure | Sensitivity normalized to base structure | Crosstalk between adjacent pixels |
| --- | --- | --- |
| without webs + slits | 1 | 33% |
| with webs | 0.28 | <1% |
| with webs + slits | 0.82 | <1% |
| with webs + slits and base structure reduced to 1/4 | 2.4 | <1% |

Production of the device proceeds as follows: a) provide detector element substrate with a surface segment, at least one heat sink to generate a directed heat flow and at least one thermal regulation device to regulate the heat flow and b) arrange the thermal detector elements on the surface segment of the detector element substrate such that a directed heat flow directed away from at least one of the thermal detector elements is generated by means of the heat sink in the direction of said heat sink, and a magnitude of the heat flow can be regulated by means of the regulation device. The detector elements are mounted on the surface segment of the prefabricated detector element substrate. As an alternative to this, a detector element substrate is initially provided with the webs.

The introduction of the slits (regulation device) ensues after the arrangement of the detector elements. The arrangement of the detector elements ensues in a typical manner, for example via sputtering of the individual layers.

After the arrangement what is known as a back-side etching is implemented. Material of the silicon substrate is removed from the back side, thus the side of the silicon substrate that is facing away from the detector elements. The slits are thereby uncovered.

The device is used in a movement sensor, a presence sensor or a heat image camera.

Although modifications and changes may be suggested by those skilled in the art, it is the intention of the inventors to embody within the patent warranted heron all changes and modifications as reasonably and properly come within the scope of their contribution to the art.

We claim as our invention:

1. A device to detect thermal radiation, comprising:
a membrane formed of electrically and thermally insulating material;
a substrate supporting the membrane;
at least two detector elements situated next to each other on said membrane, each of said at least two detector elements comprising a pyroelectrically sensitive material between two electrode layers and configured to transduce thermal radiation into an electrical signal;
at least one heat sink formed as a heat dissipation path extending between said detector elements and located at a side of said membrane, said side of said membrane being selected from the group consisting of: (a) a side of said membrane facing toward said detector elements and (b) a side of said membrane facing away from said detector elements;
said heat dissipation path having a higher heat conductivity than said membrane and being in thermal conducting connection via said membrane with the at least two detector elements to discharge heat via the heat dissipation path from said detector elements; and
at least two heat barriers integrated into said membrane, said heat barriers having a lower heat conductivity than said membrane, extending between said detector elements and said heat dissipation path outside an area on said membrane on which said at least two detector elements are situated, and bracketing said heat dissipation path, to prevent heat conduction in said membrane both between said detector elements and between said detector elements and said heat dissipation path, thereby lowering crosstalk between said detector elements, wherein said heat barriers are formed by an evacuated recess extending fully through both said membrane and said substrate.

2. A device as claimed in claim 1, wherein said heat dissipation path is comprised of silicon.

3. A device as claimed in claim 2 wherein said heat dissipation path comprises at least one web in said membrane.

4. A device as claimed in claim 3 wherein said heat dissipation path comprises a plurality of webs surrounding a region of said membrane in which at least one of said detector elements is situated.

5. A device as claimed in claim 1 wherein said heat barriers are formed by an evacuated recess in said membrane.

6. A device as claimed in claim 5 wherein said evacuated recesses are formed as slits in said membrane proceeding between two of said detector elements that are adjacent to each other, said slits proceeding perpendicularly to an imaginary connection line defined by said at least two detector elements.

7. A device as claimed in claim 6 wherein said heat dissipation path is located between said slits to thermally insulate said heat dissipation path from said detector elements except for said heat-conductive connection.

8. A device as claimed in claim 1 wherein each of said detector elements has a short response time.

9. A device as claimed in claim 1 wherein the membrane consists of a single layer of electrically and thermally insulting material.

10. A device as claimed in claim 1 wherein the membrane consists of multiple layers, each of electrically and thermally insulting material.

11. A device as claimed in claim 1 wherein the membrane is made of at least one of silicon dioxide and silicon nitride.

12. A device as claimed in claim 1 wherein the heat dissipation path is formed as a thin film arranged on the membrane.

13. A sensor apparatus comprising a device as claimed in claim 1 and configured as at least one of a movement sensor, a presence sensor and a heat-image camera.

14. A method to manufacture a device to detect thermal radiation, comprising:
   providing a substrate comprising a membrane of electrically and thermally insulating material;
   situating at least two detector elements next to each other on said membrane, each of said at least two detector elements comprising a pyroelectrically sensitive material between two electrode layers to transduce thermal radiation into an electrical signal;
   providing at least one heat dissipation path extending between said detector elements and at a side of said membrane, said side of said membrane being selected from the group consisting of: (a) a side of said membrane facing toward said detector elements and (b) a side of said membrane facing away from said detector elements, said heat dissipation path having a higher heat conductivity than said membrane, and placing said heat dissipation path in thermal conducting connection via said membrane with the at least two detector elements to discharge heat via said heat dissipation path from said detector elements; and
   integrating at least two heat barriers into said membrane, between said detector elements and said heat dissipation path outside an area on said membrane on which said at least two detector elements are situated, and bracketing said heat dissipation path, to prevent heat conduction in said membrane both between said detector elements and between each of said detector elements and said heat dissipation path, thereby lowering crosstalk between said detector elements, said heat barrier having a lower heat conductivity than said membrane, wherein said heat barriers are formed by an evacuated recess extending fully through both said membrane and said substrate.

15. A device to detect thermal radiation, comprising:
   a membrane provided on a silicon substrate and formed of electrically and thermally insulating material;
   at least two detector elements situated next to each other on said membrane, each of said at least two detector elements comprising a pyroelectrically sensitive material between two electrode layers and configured to transduce thermal radiation into an electrical signal;
   at least one heat dissipation path extending between said detector elements and located at a side of said membrane facing toward said detector elements;
   said heat dissipation path having a higher heat conductivity than said membrane and being in thermal conducting connection via said membrane with the at least two detector elements to discharge heat from said detector elements via said heat dissipation path;
   said heat dissipation path formed by a thin film provided on said membrane between said detector elements to lower thermal crosstalk between said detector elements; and
   at least two heat barriers integrated into said membrane, said heat barriers having a lower heat conductivity than said membrane, extending between said detector elements and said heat dissipation path outside an area on said membrane on which said at least two detector elements are situated, and bracketing said heat dissipation path, to prevent heat conduction between said detector elements and from one of said detector elements to said heat dissipation path, thereby lowering crosstalk between said detector elements, wherein said heat barriers are formed by an evacuated recess extending fully through both said membrane and said silicon substrate.

16. A device as claimed in claim 15 wherein said heat barrier is formed as an evacuated slit in said membrane.

17. A device as claimed in claim 16 wherein said slit is a first slit, and wherein said heat barrier comprises a second slit proceeding parallel to said first slit between said at least two detector elements.

18. A device as claimed in claim 15 wherein each of said detector elements has a short response time.

* * * * *